United States Patent [19]

Zanio

[11] Patent Number: 4,465,565
[45] Date of Patent: Aug. 14, 1984

[54] CDTE PASSIVATION OF HGCDTE BY ELECTROCHEMICAL DEPOSITION

[75] Inventor: Kenneth R. Zanio, El Toro, Calif.

[73] Assignee: Ford Aerospace & Communications Corporation, Detroit, Mich.

[21] Appl. No.: 479,545

[22] Filed: Mar. 28, 1983

[51] Int. Cl.$^3$ .......................... C25D 9/08; C25D 7/12; C25D 5/02

[52] U.S. Cl. .................................. 204/56 R; 204/15; 204/86; 250/370; 250/332

[58] Field of Search ..................... 204/15, 50.1, 56 R, 204/86; 250/370 JX, 332

[56] References Cited

U.S. PATENT DOCUMENTS

| | | | |
|---|---|---|---|
| 3,489,658 | 1/1970 | Randall et al. | 204/56 R |
| 3,492,167 | 1/1970 | Nakayama et al. | 204/50.1 |
| 3,977,018 | 8/1976 | Catagnus et al. | |
| 3,988,774 | 10/1976 | Cohen-Solal et al. | |
| 4,005,472 | 1/1977 | Harris et al. | 204/15 X |
| 4,260,427 | 4/1981 | Fulop et al. | 136/255 |
| 4,318,217 | 3/1982 | Jenner et al. | 204/56 R X |
| 4,418,096 | 11/1983 | Gauthier et al. | 427/76 |

FOREIGN PATENT DOCUMENTS 1532616 11/1978 United Kingdom.
2006268 5/1979 United Kingdom.

OTHER PUBLICATIONS

Panicker et al., "Cathodic Deposition of CdTe from Aqueous Electrolytes", J. Electrochem. Soc., vol. 125, No. 4, pp. 566-572, Apr. 1978.

Migliorato et al., "CdTe/HgCdTe Indium-Diffused Photodiodes", Infrared Phys., vol. 22, pp. 331-336 (1982).

Chu et al., "Liquid Phase Epitaxial Growth of CdTe/Hg$_{1-x}$Cd$_x$Te Multilayers (0.3<x<0.5)", J. Appl. Phys. 51 (4) Apr. 1980, pp. 2255-2257.

Rod et al., "Emerging Materials for Solar Cell Applications—Electrodeposited CdTe", Final Report, Feb. 14, 1979–Feb. 14, 1980, Contract No. AC04-79ET23008, U.S. Dept. of Energy, pp. 5-9.

Basol et al., "Observation of Electron Traps in Electrochemically Deposited CdTe Films", Solid State Electronics vol. 24, pp. 121-125 (1981).

Fulop et al., "High-Efficiency Electrodeposited Cadmium Telluride Solar Cells", App. Phys. Lett. 40(4), Feb. 15, 1982, pp. 327-328.

Davis et al., "Properties of Passivant Films on HgCdTe—Interaction with the Substrate", Proceedings of SPIE-The International Society for Optical Engineering, vol. 285, "Infrared Detector Materials", Apr. 20-24, 1981, pp. 126-134.

Rhiger et al., "Exploratory Development on PV HgCdTe Surface Leakage", Interim Report for Period Jul. 1, 1980 to Jun. 30, 1981, Contract No. F33615-80-C-5084, Prepared for Materials Laboratory at Wright-Patterson AFB, Nov. 8, 1981.

Primary Examiner—Howard S. Williams
Assistant Examiner—T. L. Williams
Attorney, Agent, or Firm—Edward J. Radlo; Robert D. Sanborn

[57] ABSTRACT

A thin passivating layer (14) of CdTe is formed on a layer of photoconductive HgCdTe (4) by means of electrochemical deposition. The photoconductive layer (4) is used as a cathode. A first anode (26) is fabricated of tellurium and a second anode (28) is fabricated of an inert substance such as graphite. An electrolyte (30) comprises an aqueous solution of CdSO$_4$ and unsaturated TeO$_2$. Alternatively, electrolyte (30) can be saturated with TeO$_2$, in which case a first anode is fabricated of an inert substance, and an optional second anode is fabricated of cadmium. After purifying the cathode (1) and the electrolyte (30), cadmium and tellurium are simultaneously deposited upon cathode (1). Stoichiometric balance is maintained to maximize the resistivity of the passivating CdTe layer (14). This is accomplished by regulating the deposition voltage of cathode (1) with respect to a saturated calomel electrode (22). In a first embodiment, an n-type region (16) is formed in the p-type photoconductive layer (4) subsequent to electrochemical deposition of the passivating CdTe layer (14). In a second embodiment, the n-type region (16) is formed in the p-type layer (4) prior to electrochemical deposition of the CdTe passivating layer (14).

9 Claims, 10 Drawing Figures

CDTE PASSIVATION OF HGCDTE BY ELECTROCHEMICAL DEPOSITION

DESCRIPTION

TECHNICAL FIELD

This invention pertains to the passivation of photoconductive HgCdTe (mercury cadmium telluride) with a passivating layer of CdTe (cadmium telluride). The invention is useful in the field of infrared detection.

BACKGROUND ART

U.S. Pat. No. 3,988,774 describes the coating of an intermediate layer of HgCdTe onto a photoconducting layer of HgCdTe. In one special case (col. 2, lines 31-33), the patent indicates that the concentration of mercury in the intermediate layer could be zero; in this case, the intermediate layer is CdTe as in the present invention. However, the patent teaches away from the present invention because the methods of applying the intermediate layer mentioned in the patent are cathodic sputtering, epitaxy, and vacuum evaporation (col. 2, lines 47-49), not electrochemical deposition as in the present invention. Cathodic sputtering is unacceptable for coating with CdTe because it would damage the HgCdTe surface. Furthermore, it is not an in situ process as that of the present invention, and therefore, impurities can more readily be introduced. Vapor phase epitaxy and liquid phase epitaxy are unacceptable for coating HgCdTe with CdTe because they are high temperature processes, and therefore would cause interdiffusion between the CdTe and the p-type HgCdTe, undesirably allowing mercury to deplete out of the HgCdTe. The growth of CdTe on HgCdTe using molecular beam epitaxy (MBE) has been reported in Migliorato et al., "CdTe/HgCdTe Indium-Diffused Photodiodes", *Infrared Phys.*, Vol. 22, pp. 331-336 (1982). The methods of electrochemical deposition described in the instant patent application offer the following advantages over MBE: lower cost, superior control over resistivity and conductivity type, and ability to clean the surface of the HgCdTe in a non-destructive manner. Conventional vacuum evaporation is not a viable process because of contamination problems.

Chu et al., "Liquid phase epitaxial growth of $CdTe/Hg_{1-x}Cd_xTe$ multilayers ($0.3 < x < 0.5$)," *J.Appl.Phys.* 51 (4), April 1980, pp. 2255-2257, describes the coating of CdTe on HgCdTe using liquid phase epitaxy. As stated previously, this high temperature process causes an unacceptable level of interdiffusion.

Panicker et al., "Cathodic Deposition of CdTe From Aqueous Electrolytes", *J.Electrochem.Soc.* Vol. 125, No. 4, pp. 566-572, April, 1978; and Rod et al., "Emerging Materials for Solar Cell Applications—Electrodeposited CdTe", Final Report, Feb. 14, 1979—Feb. 14, 1980, Contract No. AC04-79ET23008, U.S. Dept. of Energy, pp. 5-9, describe the cathodic deposition of CdTe on nickel or glass cathodes for photovoltaic cells, but not the deposition of CdTe on HgCdTe as in the present invention.

Basol et al., "Observation of Electron Traps in Electrochemically Deposited CdTe Films", *Solid State Electronics* Vol. 24, pp. 121-125 (1981); and Fulp et al., "High-efficiency electrodeposited cadmium telluride solar cells", *App.Phys.Lett.* 40(4), Feb. 15, 1982, pp. 327-328, describe the manufacture of photovoltaic cells using the method described in Panicker et al., supra.

Several references discuss the passivation of HgCdTe by anodic oxidation, e.g., U.S. Pat. No. 3,977,018. Although an electrochemical process, in anodic oxidation the passivation layer is a HgCdTe oxide of varying composition, not CdTe as in the present invention; and the photoconductive HgCdTe is the anode, not the cathode as in the present invention.

Several references discuss the passivation of HgCdTe using zinc sulfide, e.g., Davis et al., "Properties of passivant films on HgCdTe—interaction with the substrate", *Proceedings of SPIE—The International Society for Optical Engineering*, Vol. 285, "Infrared Detector Materials", Apr. 20-24, 1981, pp. 126-134. This process is more difficult to control reliably than the passivation with CdTe described in the present specification, and does not provide as good lattice matching.

Rhiger et al., "Exploratory Development on PV HgCdTe Surface Leakage", Interim Report for Period July 1, 1980 to June 30, 1981, Contract No. F33615-80-C-5084, prepared for Materials Laboratory at Wright-Patterson AFB, Nov. 8, 1981, describes on page 60 the passivation of HgCdTe using native oxides and silicon oxide. However, the lattice structure is not matched as in the present invention.

DISCLOSURE OF THE INVENTION

This invention addresses the problem of reducing the leakage current in HgCdTe photodiodes (1). Such devices are typically used as infrared detectors. Unwanted leakage currents are caused by surface states which enhance the surface conductance of the photoconductive HgCdTe layer (4). This leakage current problem is exacerbated at the p-n junction (4/16) where said junction intersects the surface of the photoconductive layer (4) due to increased conduction (1) from high concentration of surface states and/or (2) from a spreading and increased area of the p-n junction (4/16) due to an inversion of the surface by surface states. As described in the Background Art section above, several techniques have been suggested to passivate the HgCdTe layer (4) in an encapsulating layer, thus reducing the level of surface states and reducing the leakage currents.

This invention is a method for passivating the HgCdTe layer (4) by means of the electrochemical deposition of a passivating layer (14) of CdTe.

CdTe as a passivation layer (14) offers the following advantages: it has a wide bandgap (approximately 1.5 eV); it is lattice matched to HgCdTe; it can be made to have a high resistivity, especially at low temperatures; and the surface and interface state densities are low due to the good lattice match between HgCdTe and CdTe.

The particular method of CdTe passivation described herein, that of electrochemical deposition, offers the following advantages:

(1) The method is performed at low temperature, approximately 100° C., minimizing conductivity changes in the HgCdTe layer (4) due to mercury depletion.

(2) The HgCdTe layer (4) can be electrochemically cleaned prior to passivation, to remove surface oxides and other contaminants. Although this can be done with liquid phase epitaxy (LPE) melt back techniques, LPE is unacceptable because interdiffusion occurs at the high temperature of LPE growth, and LPE causes unacceptably large ripples in the surface of the photoconductive layer (4).

(3) The surface of the HgCdTe layer (4) is not damaged as in cathodic sputtering methods.

(4) The method does not cause interdiffusion between the HgCdTe and other layers.

(5) The method is performed in situ, enhancing reliability and purity.

(6) The conductivity and type of the CdTe layer (14) can be controlled by varying the potential of the cathode (1) in the electrochemical process.

(7) The CdTe layer (14) offers a good lattice match to the HgCdTe layer (4) and a similar coefficient of thermal expansion.

(8) The HgCdTe layer (4) cannot be unintentionally doped by the passivating layer (14).

BRIEF DESCRIPTION OF THE DRAWINGS

These and other more detailed and specific objects and features of the present invention are more fully disclosed in the following specification, reference being had to the accompanying drawings (not drawn to scale), in which:

FIG. 1a shows the preparation of the photodiode precursor 1 prior to immersion in the electrochemical deposition bath;

FIG. 1b illustrates the apparatus for performing the electrochemical deposition of the CdTe layer 14 onto the HgCdTe layer 4;

FIG. 1c illustrates the state of the photodiode precursor 1 just after it has been electrochemically coated with the CdTe layer 14;

FIG. 1d illustrates the implantation of an n-type region 16 into the p-type layer 14;

FIG. 1e illustrates the state of the photodiode 1 after final processing steps have been completed.

FIG. 2a illustrates a p-type layer of HgCdTe 4 with an n-type region 16 implanted therein;

FIG. 2b illustrates the state of the photodiode precursor 1 prior to immersion in the electrochemical deposition bath;

FIG. 2c illustrates the apparatus for effectuating the electrochemical deposition of the CdTe passivation layer 14 onto the photoconductive layer 4;

FIG. 2d illustrates the state of the photodiode presursor 1 after it has been coated with the passivation layer 14; and FIG. 2e illustrates the finished state of the photodiode 1.

DETAILED DESCRIPTION OF THE PREFERRED EMBODIMENTS

Figure 1A:
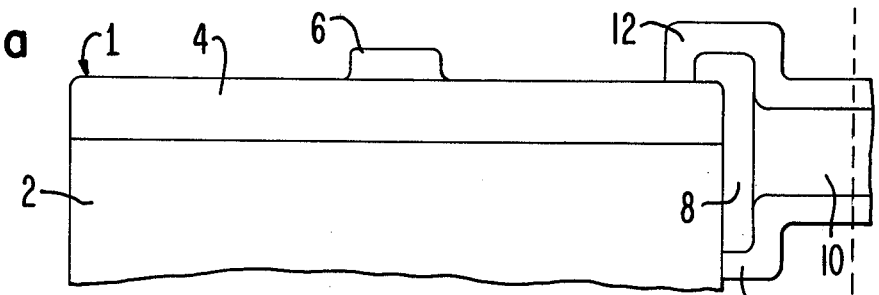
FIGS. 1a through 1e illustrate a series of sequential steps describing a first embodiment of the present invention; more specifically.

A first embodiment is described in FIGS. 1a through 1e. The HgCdTe photoconductive layer 4 is usually p-type because (1) n-type regions are easily formed by ion implantation in p-type material and (2) the diffusion length for electrons (when electrons are the minority carrier in p-type material) is greater than the diffusion length for holes (when holes are the minority carrier in n-type material).

Layer 4, a principal ingredient in what will become photodiode 1, is typically between 10 microns and 20 microns in thickness, and has been epitaxially grown on a non-conducting inert substrate 2, fabricated of, e.g., CdTe. If photoconductive layer 4 is less than 20 microns in thickness, the photons of infrared radiation may be incident on its substrate 2 side; if, however, the thickness of layer 4 is greater than 20 microns, the photons of infrared radiation may be incident on its opposing side, on which is formed a p-n junction. The length of each of photoconductive layer 4 and substrate 2 is typically about two centimeters.

A metal contact 8 is formed, e.g. by deposition, on one end of layer 4. Because of the thinness of layer 4, contact 8 typically extends onto a portion of inert substrate 2. A wire 10, preferably of the same material as contact 8, is conductively bonded to contact 8 with sufficient strength to mechanically support the photodiode precursor 1 during the subsequent electrochemical deposition step (FIG. 1b). An insulating encapsulant 12 is coated over contact 8 and at least that portion of wire 10 which will be immersed in the electrochemical bath, so that contact 8 and wire 10 will not contaminate the bath.

A mesa of photoresist 6 having a thickness of between 400 and 2000 angstroms is deposited onto a portion of the exposed (in this case, upper) surface of photoconductive layer 4. Photoresist 6 is fabricated of anything which does not absorb radiation.

Photodiode precursor 1 is now ready for electrochemical deposition with a thin (400 angstrom to 2000 angstrom) passivating layer 14 of CdTe. The stoichiometry of the electrodeposited CdTe should be generally maintained, i.e., rroughly equal amounts of Cd and Te should be deposited. Stoichiometric CdTe is neither p-type nor n-type, and offers greater surface resistivity than non-stoichiometric CdTe.

Figure 1B:
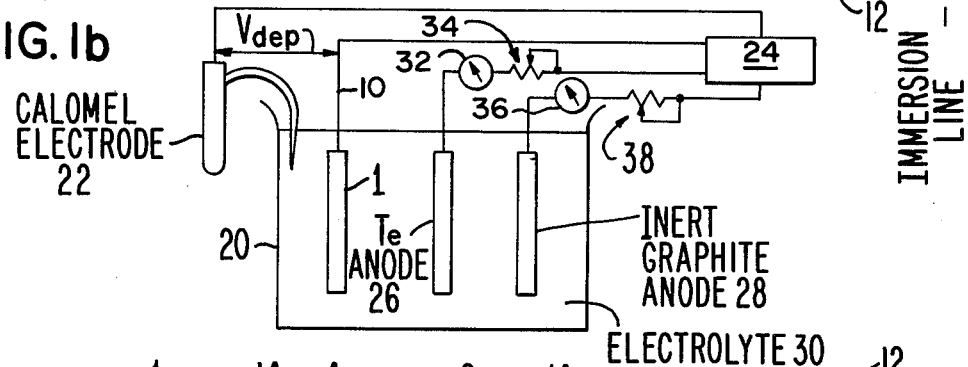

In FIG. 1b, the precursor 1 of FIG. 1a is immersed in liquid electrolyte 30 contained within beaker 20. Precursor 1 becomes the cathode in the electrochemical deposition process described in FIG. 1b. Cathodic, rather than anodic, deposition is preferable because in anodic deposition the stoichiometry of the deposited layer cannot be easily regulated. A heater (not illustrated) heats electrolyte 30 to the desired temperature, and a magnetic stirrer (not illustrated) of variable rotation speed stirs electrolyte 30. A saturated calomel electrode (SCE) 22 sets a reference voltage for cathode 1. The voltage of cathode 1 with respect to SCE 22 is designated $V_{dep}$. Potentiostat/galvanostat 24 regulates $V_{dep}$ and provides a source of electrons that flow into anodes 26 and 28. Ammeters 32 and 36 monitor the current flowing into anodes 26 and 28, respectively. Potentiometers 34 and 38 control the ratio of current flowing into anodes 26 and 28.

Electrolyte 30 comprises an aqueous solution of chemicals which provide Cd and Te ions, typically $CdSO_4$ and $TeO_2$. These become ionized to $Cd^{++}$ and $HTeO_2^+$. In the embodiment illustrated herein, electrolyte 30 is not saturated with $TeO_2$. In this embodiment, two anodes are used. Anode 26 is fabricated of tellurium and anode 28 is fabricated of an inert substance such as graphite. The low solubility of $H_2TeO_3$ and the need to limit the concentration of $HTeO_2^+$ in electrolyte 30 in order to be able to deposit Cd and Te in equal amounts restricts the $HTeO_2^+$ concentration to a relatively low value. The presence of the two anodes permits these concentrations to be kept constant. Current passing through anode 26 injects $HTeO_2^+$ into the solution. The current flowing through anode 26 is made equal to twice the current flowing through anode 28 (by adjusting potentiometers 34 and 38 and monitoring the results by ammeters 32 and 36), so that just as much Te is injected into the solution as is deposited onto cathode 1, and the $HTeO_2^+$ concentration in electrolyte 30 remains constant.

The concentration of $TeO_2$ is between $10^{-5}$ and $10^{-3}$ moles per liter. The concentration of the $CdSO_4$ is between 0.5 mole per liter and 1 mole per liter, for a pH of approximately 1.4 to 3.5. The concentration of the Cd must be higher than that of the Te because it is less noble.

The temperature during deposition is kept steady at a value between room temperature and 150° C., preferably about 100° C. The crystallinity of CdTe layer 14 is advantageously enhanced as the temperature rises. Too high a temperature, however, will disadvantageously cause depletion of Hg from the HgCdTe layer 4. The stirring rate is set to between 25 and 250 revolutions per minute, typically around 160 rpm. Increasing the stir rate increases the plating current density (current flowing into cathode 1 per surface area of cathode 1) and thus the rate of deposition of layer 14 onto cathode 1.

$V_{dep}$ is a fixed voltage of between $-1.0$ and $-0.1$ volts and is maintained constant by the potentiostat portion of device 24. $V_{dep}$ is the major means by which the composition of the passivating layer 14 is controlled. $V_{dep}$ in its least negative end of its range (which causes a low plating current density) produces more Te deposition than Cd deposition, and therefore the resultant CdTe layer 14 is p-type. $V_{dep}$ at its most negative end of its range (which causes a high plating current density) causes more Cd than Te deposition, and thus n-type CdTe. The rest potential (voltage on cathode 1 versus SCE 22 immediately after discontinuance of the plating current) of the desired stoichiometric CdTe is about $-0.3$ volts. The $V_{dep}$ corresponding to this is approximately $-0.5$ volts, depending upon the discharge overpotential, the plating current density, and the resistance per surface area of cathode 1, which changes over time as layer 14 builds up on cathode 1. The optimum $V_{dep}$ is determined empirically: if a test layer 14 is Te-rich, $V_{dep}$ should be made more negative; if, on the other hand, layer 14 is Cd-rich, $V_{dep}$ should be adjusted to be less negative.

The cathodic deposition is performed until a passivating layer 14 of the desired thickness (0.04 to 0.2 microns) is formed. This will take roughly between twenty minutes and five hours. The deposition rate is independent of $Cd^{++}$ concentration and proportional to the $TeO_2$ concentration, since the deposition process is limited by Te diffusion. The deposition rate is also a function of $V_{dep}$: making $V_{dep}$ more negative increases the deposition rate, and vice versa. The deposition rate is also directly proportional to the stir rate, which should be adjusted, after the optimum $V_{dep}$ has been established, to provide a deposition rate of about one micron per hour.

The plating current density is directly proportional to the deposition rate and is thus also a function of the $TeO_2$ concentration, $V_{dep}$, and the stir rate. The plating current density is nominally between 0.1 ma/cm$^2$ and 0.5 ma/cm$^2$.

Prior to the actual step of electrochemical deposition, it is desirable to remove impurities from electrolyte 30. This can be accomplished by means of using a dummy cathode, e.g. of platinum, and plating out those impurities which have an electrochemical potential more positive than cadmium onto the dummy cathode to less than 0.1 part per million.

It is also desirable to remove impurities from the surface of the photoconductive layer 4. This can be accomplished by using precursor 1 as the cathode and using dummy anodes, then removing the dummy anodes prior to initiation of the actual CdTe electrochemical deposition process.

Alternative to not saturating electrolyte 30 with $TeO_2$, electrolyte 30 is kept saturated with $TeO_2$. In this case, either one or two anodes are used. The first anode is made of an inert substance such as graphite and the other anode is optional: if used, it consists of cadmium. When two anodes are used, the current flowing through the inert anode should be twice the current flowing through the cadmium anode, to keep constant the concentrations of both cadmium and tellurium in electrolyte 30, and thus preserve the stoichiometry of the deposited layer 14.

Figure 1C:
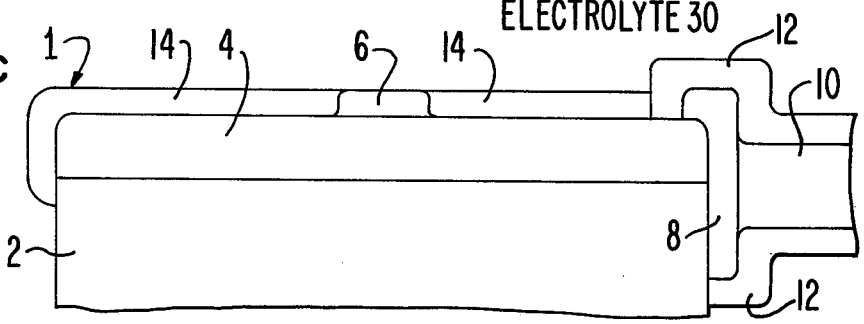

The CdTe-coated precursor 1 is removed from the electrolyte 30. Its condition is illustrated in FIG. 1c. All of the exposed photoconductive layer 4 has been coated as desired. The CdTe layer 14 does not deposit on the photoresist 6.

Figure 1D:
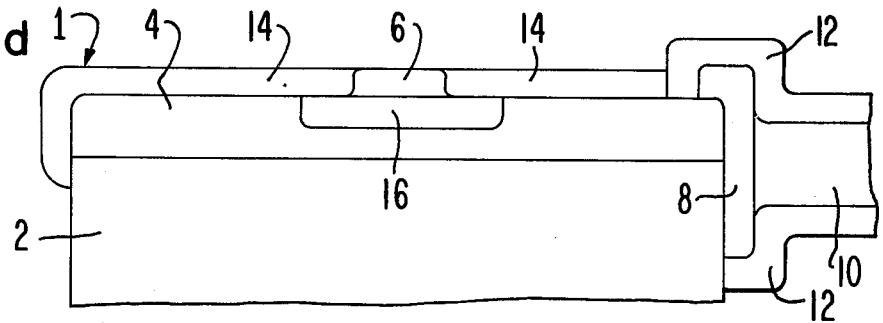

FIG. 1d illustrates that n-type region 16 is formed in the upper surface of p-type layer 4 so as to form a p-n diode junction. A large number of such closely spaced p-n diode junctions may be formed on each substrate 2. The cross-section of each region 16 (viewed from above) is typically about 50 microns by 50 microns. Region 16 is formed underneath mesa 6 and covers more of the surface of layer 4 than does mesa 6. Region 16 is preferably formed by ion implantation but other techniques can be used as well. Implantation through the CdTe layer 14 advantageously further increases the resistivity of the CdTe layer 14, especially if a p-type ion is used as the implanting specie.

Figure 1E:
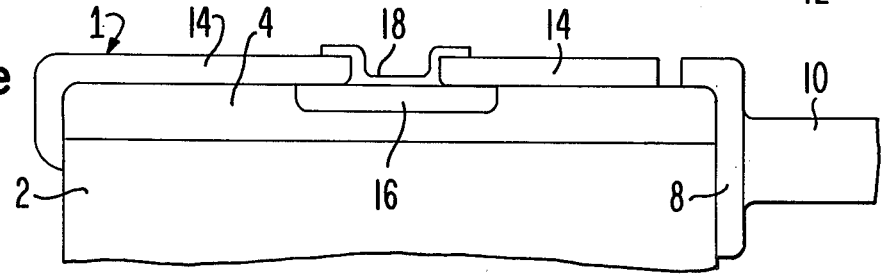

As illustrated in FIG. 1e, photoresist 6 is removed, e.g. by dissolving in J-100, acetone, or another solvent. Encapsulant 12 may be removed. A metal, e.g. gold, contact 18 is formed on n-type region 16, e.g. by a photolithographic process. Photodiode 1 is now ready for use as an infrared detector.

Figure 2A:
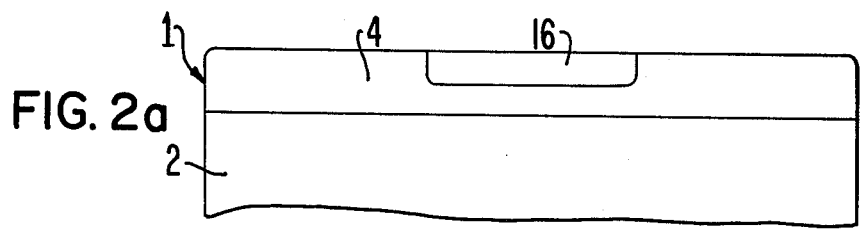
FIGS. 2a through 2e illustrate a series of sequential steps describing a second embodiment of the present invention; more particularly.
Figure 2B:
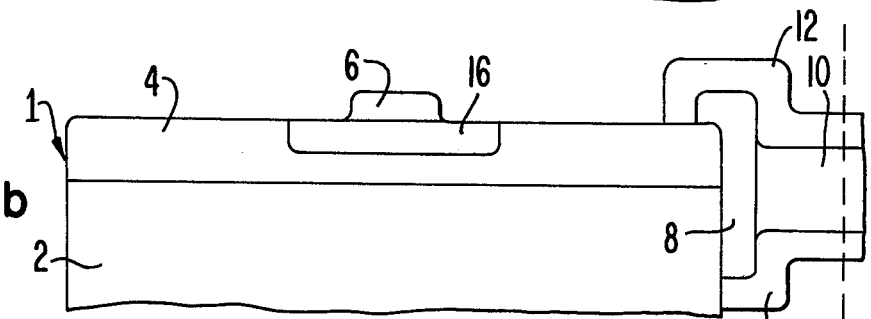

A second embodiment is illustrated in FIGS. 2a through 2e. This embodiment offers an advantage over the FIG. 1 embodiment in that it avoids ion implantation through photoresist 6. Thus, in the second embodiment, the p-n junction is formed prior to electrochemical deposition, by implanting or otherwise forming an n-type region 16 in the p-type HgCdTe layer 4, as illustrated in FIG. 2a.

A mesa of photoresist 6 is now deposited on part of the n-type region 16, leaving the p-n junction exposed at the surface of the photoconductive layer 4. Contact 8, wire 10, and encapsulant 12 are formed as in the FIG. 1 embodiment.

Figure 2C:
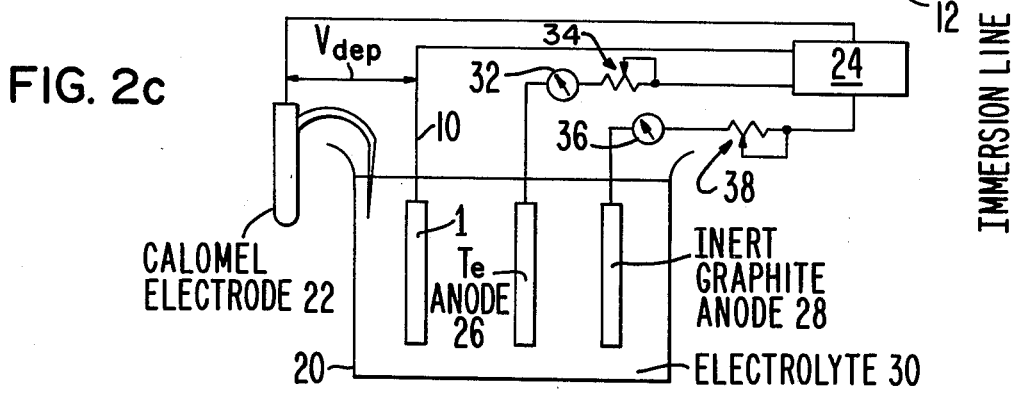

A 400 angstrom to 2000 angstrom passivating layer 14 of CdTe is then deposited by cathodic deposition using the apparatus illustrated in FIG. 2c. Details for this process are as in the FIG. 1 embodiment. The p-n junction that is present on cathode 1 might be expected to isolate the exposed region 16 from substrate 2, thus reducing the rate of deposition of the CdTe layer 14. However, the intrinsic generation of free carriers in the p-n junction at the temperatures employed in the electrochemical deposition process decreases the resistance of the p-n junction and reduces the degree of this isolation.

Figure 2D:
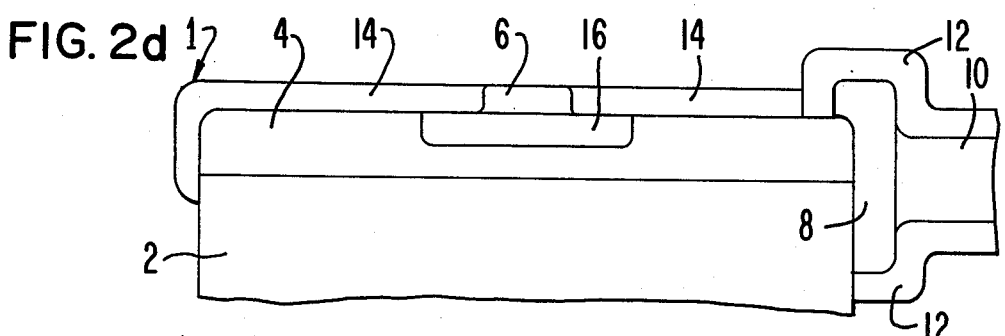
Figure 2E:
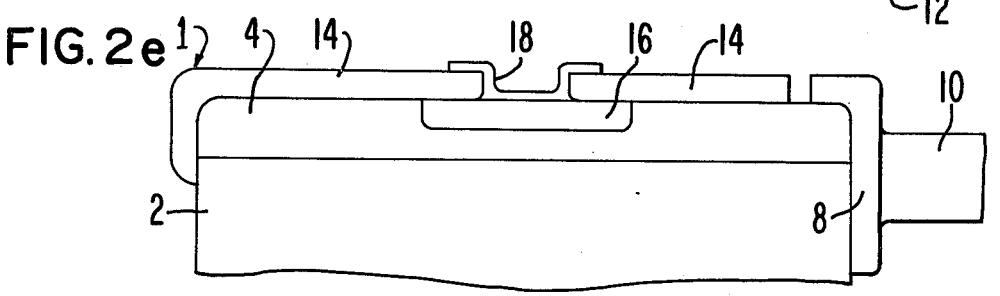

The result of the electrochemical deposition process is illustrated in FIG. 2d. Once again, the passivating layer 14 of CdTe coats the entire exposed surface of the photoconductive HgCdTe layer 4, particularly the p-n junction 4/16, but photoresist 6 is not coated. The end product 1, illustrated in FIG. 2e, is formed by following the same steps outlined above in conjunction with the FIG. 1 embodiment.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A method for passivating a layer of photoconductive crystalline HgCdTe, comprising the step of lattice-matching a thin passivating layer of electrically insulating crystalline CdTe onto an exposed surface of the HgCdTe by means of cathodic electrochemical deposition; wherein:

the HgCdTe layer is a cathode immersed in a liquid electrolyte containing cadmium ions and tellurium ions in solution;
   the deposition is performed at a temperature of between room temperature and 150° C.;
   the concentration of the cadmium ions in solution is between 0.5 mole/liter and 1 mole/liter;
   the concentration of tellurium ions in solution is between $10^{-5}$ moles/liter and $10^{-3}$ moles/liter;
   the pH of the solution is approximately 1.4 to 3.5; and
   the plating current density is nominally between 0.1 ma/cm$^2$ and 0.5 ma/cm$^2$.

2. The method of claim 1 wherein the thickness of the deposited layer of CdTe is between 400 angstroms and 2000 angstroms.

3. The method of claim 1 wherein the HgCdTe is p-type.

4. The method of claim 3 wherein prior to the step of forming the layer of CdTe, a mesa of photoresist is formed on a portion of the exposed surface of the HgCdTe, and a conductive contact is formed on another portion of the exposed surface of the HgCdTe; said method further comprising, subsequent to the step of forming the passivating layer of CdTe, the following steps:

forming in the p-type HgCdTe an n-type region underneath the mesa of photoresist that covers more of the surface of the p-type HgCdTe than does the mesa;
   removing the mesa; and
   forming a conductive contact on the n-type region.

5. The method of claim 3 further comprising the following steps:

prior to the step of forming the passivating CdTe layer, forming an n-type region in the p-type HgCdTe at a portion of its exposed surface;
   forming a conductive contact on another portion of the exposed surface of the p-type HgCdTe; and
   forming a mesa of photoresist over part of the n-type region;
   wherein, at the conclusion of the passivating step, the CdTe layer covers remaining portions of the exposed surface of the p-type HgCdTe and that portion of the n-type region not covered with photoresist, but the CdTe layer does not cover the mesa of photoresist;
   and, subsequent to the step of forming the passivating CdTe layer, the photoresist is removed from the n-type region and an electrical contact is formed in its stead.

6. The method of claim 1 wherein an anode fabricated of cadmium is also immersed in the electrolyte.

7. The method of claim 1 wherein the deposition voltage, as measured between the cathode and a saturated calomel electrode, is kept constant at a value that will preserve substantial stoichiometry in the deposited CdTe passivating layer.

8. The method of claim 1 wherein a first anode made of tellurium and a second anode made of an inert substance are also immersed in the electrolyte.

9. The method of claim 8 wherein during the deposition of the CdTe the current flowing through the first anode is made to be substantially equal to twice the current flowing through the second anode.

* * * * *